United States Patent
Alfke et al.

(10) Patent No.: US 6,810,514 B1
(45) Date of Patent: Oct. 26, 2004

(54) CONTROLLER ARRANGEMENT FOR PARTIAL RECONFIGURATION OF A PROGRAMMABLE LOGIC DEVICE

(75) Inventors: Peter H. Alfke, Los Altos Hills, CA (US); Scott P. McMillan, Santa Clara, CA (US); Brandon J. Blodget, Santa Clara, CA (US); Delon Levi, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 61 days.

(21) Appl. No.: 10/188,510

(22) Filed: Jul. 3, 2002

(51) Int. Cl.⁷ .......................... G06F 17/50; G06F 19/50
(52) U.S. Cl. .......................................... 716/16; 716/17
(58) Field of Search ............................. 716/1, 16–17; 326/38–41

(56) References Cited

U.S. PATENT DOCUMENTS

| | | | | |
|---|---|---|---|---|
| 5,535,406 A | * | 7/1996 | Kolchinsky | 712/10 |
| 5,705,938 A | * | 1/1998 | Kean | 326/39 |
| 5,801,547 A | * | 9/1998 | Kean | 326/40 |
| 6,020,758 A | * | 2/2000 | Patel et al. | 326/40 |
| 6,191,614 B1 | * | 2/2001 | Schultz et al. | 326/41 |
| 6,255,848 B1 | * | 7/2001 | Schultz et al. | 326/41 |
| 6,255,849 B1 | * | 7/2001 | Mohan | 326/41 |
| 6,288,568 B1 | | 9/2001 | Bauer et al. | |
| 6,304,101 B1 | * | 10/2001 | Nishihara | 716/16 |

OTHER PUBLICATIONS

U.S. patent application Ser. No. 10/164,508, Young et al., filed Jun. 2002.

\* cited by examiner

*Primary Examiner*—Matthew Smith
*Assistant Examiner*—Paul Dinh
(74) *Attorney, Agent, or Firm*—LeRoy D. Maunu; Edel M. Young; Lois D. Cartier

(57) ABSTRACT

Method and apparatus for partial reconfiguration of a programmable logic device (PLD). In one embodiment, a configuration store is arranged for storage of configuration data for a selected subset of the reconfigurable resources of the PLD. A modification store is configured with addresses and associated data values. Each address in the modification store references an address in the configuration store, and each associated data value indicates a configuration state for one of the reconfigurable resources of the PLD. A controller is coupled to the configuration and modification stores and to the PLD. In response to a reconfiguration signal, the controller reads an address and associated data value from the modification store, updates the configuration store at the address read from the modification store with the associated data value, and downloads configuration data from the configuration store to the PLD.

22 Claims, 4 Drawing Sheets

⟵ 452

| relative word offset | relative bit offset | state |
|---|---|---|
| relative word offset | relative bit offset | state |
| relative word offset | relative bit offset | state |
| ⋮ | | |
| relative word offset | relative bit offset | state |

| address 0 | address 16384 | address 32768 | | address 1015808 | address 1032192 |
|---|---|---|---|---|---|
| reconfiguration block 0 | reconfiguration block 1 | reconfiguration block 2 | ... | reconfiguration block 62 | reconfiguration block 63 |
| address 16383 | address 32767 | address 49151 | | address 1048574 | address 1048575 |

CONTROLLER ARRANGEMENT FOR PARTIAL RECONFIGURATION OF A PROGRAMMABLE LOGIC DEVICE

FIELD OF THE INVENTION

The present invention generally relates to partial reconfiguration of programmable logic devices.

BACKGROUND

Programmable logic devices (PLDS), such as field programmable gate arrays (FPGAs), are increasingly being used in applications where ASICs have traditionally been used, and in other applications to supplement the capabilities of microprocessors.

Some FPGAS, such as the Virtex-II FPGA from Xilinx, Inc., support partial reconfiguration. That is, once configured, selected resources of the FPGA can be reconfigured without having to reconfigure the entire device. Partial reconfiguration has often been performed under software control. For example, the JBits environment from Xilinx supports software-controlled full and partial reconfiguration of an FPGA.

Software-controlled reconfiguration provides flexibility in developing a reconfiguration controller that meets application-specific requirements. However, software-controlled reconfiguration may be too slow for certain applications. The latency associated with execution of the program code that controls the reconfiguration may be too slow for some application requirements.

A system and method that address the aforementioned problems, as well as other related problems, are therefore desirable.

SUMMARY OF THE INVENTION

The present invention provides a circuit arrangement for partial reconfiguration of a programmable logic device (PLD). In one embodiment, a modification table is configured with addresses and associated data values for implementing desired changes in the configuration. A configuration store stores a copy of the configuration store of the PLD. Each address in the modification store references an address in the configuration store, and each associated data value indicates a configuration state for that address. The configuration store may store configuration data for all or a selected subset of the reconfigurable resources of the PLD. A controller is coupled to the modification and configuration stores and to the PLD. In response to a reconfiguration signal, the controller reads an address and associated data value from the modification store, updates the configuration store at the address read from the modification store with the associated data value, and subsequently downloads configuration data from the configuration store to the PLD.

The modification store may include data and addresses for every value in the configuration store that can be changed, or if the PLD is implementing a highly repetitive function, the modification store can store a repetitive unit of configuration changes, and the controller can determine where in the configuration store to make the changes specified by the repetitive unit.

Various other embodiments are set forth in the Detailed Description and Claims which follow.

BRIEF DESCRIPTION OF THE DRAWINGS

FIG. 7 illustrates an example format of data stored in the modification store for a repetitive column embodiment.

FIG. 8 illustrates an example layout of the configuration store, broken into reconfiguration blocks, for an application-specific implementation.

DETAILED DESCRIPTION

The present invention supports fast, partial reconfiguration of a programmable logic device (PLD). A data set in a configuration store describes the current configuration of the PLD. A data set in a modification store is configured with data elements for different configuration states of selected resources of the PLD. In the modification store, each of the data elements has an associated address that references configuration data in the configuration store. Based on application-specific reconfiguration requirements, a hardware controller reads data elements from the modification store, updates referenced configurations in the configuration store and downloads changed configuration data to the PLD.

Figure 1:
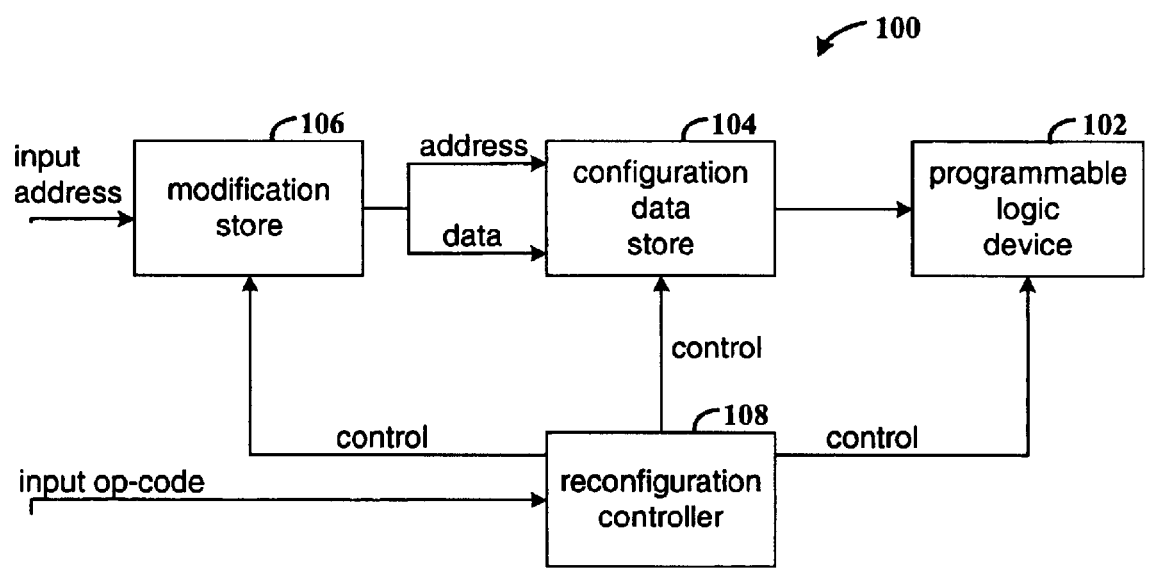
FIG. 1 is a functional block diagram of a circuit arrangement 100 for partial reconfiguration of a PLD in accordance with one embodiment of the invention.

FIG. 1 is a functional block diagram of a circuit arrangement 100 for partially reconfiguring a PLD 102 in accordance with one embodiment of the invention. Configuration store 104 stores configuration data that reflects the current configuration of the PLD. Modification store 106 references each changeable element of configuration data and lists states of the configuration data to achieve particular configurations. Reconfiguration controller 108 controls update of the configuration store 104 and reconfiguration of the PLD 102. The reconfiguration controller 108 is coupled to the PLD via the configuration ports of the PLD. It will be appreciated that different PLDs will have different requirements in terms of timing and data formats for performing configuration. In one embodiment, the reconfiguration controller is implemented as a standalone integrated circuit, e.g., an ASIC or PLD. In an alternative embodiment, the controller is implemented on the PLD that is being partially reconfigured, and occupies a portion of the PLD not subject to partial reconfiguration.

The configuration data that are used by controller 108 to partially reconfigure the PLD are stored in configuration store 104. In one embodiment, the configuration data are limited to configuring a subset of the resources of the PLD. For example, if the PLD implements a reconfigurable crossbar switch, the configuration data may be limited to resources associated with changing connections between sources and destinations, such as IMUX configurations in the Virtex-II FPGA. Or if one portion of the PLD implements a counter that may change certain parameters, an encryption key that is to be changed, a CRC code generator that is to change connectivity, the configuration data may be limited to portions of the PLD that change when the counter, key, or CRC code generator parameters change. (These are only a few example applications of the invention; many others are also possible.) In other embodiments, the configuration store may include configuration data for all the configurable resources of the PLD. The different states that are possible for the subset of resources are listed in the modification data that are stored in modification store 106.

In response to an input operation code that specifies how the PLD is to be partially reconfigured, controller 108 reads modification addresses and data from the modification store 106 or from an external source such as the input specification, updates the configuration store 104 at the addresses provided by the modification store (or an address provided externally) using the data referenced by the modification store 106, and subsequently downloads frames including the updated configuration data to the PLD 102. It will be appreciated that the particular protocol by which the controller 108 performs the partial reconfiguration depends on the particular PLD undergoing partial reconfiguration and on the type of configuration in the PLD.

In an example embodiment, an input address is provided to the modification store 106 along with the input operation code (for example, "make" or "break" in the case of a crossbar switch or "count up" or "count down" in the case of a counter) at is input to the reconfiguration controller 108. The addressed modification data are then read as soon as the reconfiguration controller 108 asserts a read signal to the modification store 106. In one embodiment, the modification store 106 includes several modifications for each input specification, and controller 108 provides an address sequence to cause modification store 106 to provide several modifications to configuration store 104.

The address component of the modification data element may be input directly to the address ports of the configuration data store, and the data component (or configuration state) of the modification data element input to the data port of the configuration data store 104. Alternatively, if one instruction requires that several portions of the PLD changed and the portions to be reconfigured are highly repetitive, a hierarchical method may be chosen. This is beneficial when the PLD is of a type that is configured by loading whole frames at a time, and there are several frames that must be configured to determine how the data in a column of CLBS is configured. In this case, the modification store includes data for only one representative CLB column, since all columns are the same. Or the modification store includes data for only one representative CLB within a column, since all CLBs are the same. If CLB columns or individual CLBs have minor differences, it may be possible to store these different portions repetitively but to store portions that are exactly the same only one time.

When a system identifies a location to be changed, the position within the CLB column or within the CLB is determined by the modification store, and the controller provides that part of the address indicating which CLB column (or CLB) is to be reconfigured to the configuration store 104. The address and data from the modification store 106 are combined with the address of the column or CLB being modified to determine the absolute address and data to be changed in the configuration store 104. The configuration controller 108 write-enables the configuration store 104 when the modification data is available. After modifications to configuration store 104 are complete, the reconfiguration controller 108 then causes configuration store 104 to download a partial bitstream of the updated configuration data to the PLD 102.

In one application, the process of FIG. 1 is used to control configuration of a crossbar switch. A large crossbar switch is described by Young, Alfke, Bauer and Fewer in U.S. patent application Ser. No. 10/164,508, entitled "Large Crossbar Switch Implemented in FPGA" filed Jun. 5, 2002. This patent application is incorporated herein by reference. An embodiment of this switch having about 1000 inputs and 1000 outputs, with a resultant 1 million connections, requires 1 million (or more) table entries. The present invention can be used to control the above referenced crossbar switch.

When a user desires to change the connectivity of the crossbar switch, the resources of FIG. 1 are activated.

Embodiment in which Modification Store Recites All Changes

In a first embodiment, a modification store 106 stores entries for each of the possible connections from an input terminal to an output terminal of the crossbar switch. Each entry in modification store 106 specifies addresses of several transistors that must be turned on or off to make a connection from an input line to an output line, and several transistors that must be turned on or off to break a connection but reconnect a vertical line in order to pass a signal from another connection towards the output line. In one variation of this embodiment, each entry in modification store 106 also stores a latency value that must be inserted into the connection path when the connection is desired, in order for all connections to have the same latency.

A configuration store 104 is modified by modification store 106 to update a replica of the changeable part of the PLD 102 configuration. Data in the configuration store 104 is then transmitted to the PLD 102 to partially reconfigure the PLD and thus achieve the new connectivity. These changes are controlled by controller 108.

Input data provided by the system specifies an address or connection to be changed and an op code specifying the kind of change needed, either made or broken. In one embodiment, the input specification is a 22-bit value having 10 bits to specify one of 1024 input values, 10 bits to specify one of 1024 output values, one input op code bit to indicate whether the connection is to be made or broken, and one START bit to trigger the controller 108 to start a change process. 21 of the bits are applied to modification store 106, and the START bit is applied to controller 108. This START bit causes controller 108 to initiate a sequence of steps. 20 of the 21 bits applied to modification store 106 identify one of the million entries.

In one embodiment, each of the million entries specifies eight change instructions, four for making a connection, and four for breaking the connection. Each change instruction recites the address of a transistor in the PLD and one bit of data to indicate whether a zero or a one will be loaded into a memory cell of the PLD to control that transistor. Controller 108 cycles through a 4-step address sequence, which causes modification store 106 to output four sequential modification instructions, one for each of the four bits being modified, each in the form of a wide address and a data bit. Each of the million entries may further recite changes needed to equalize latency, and controller 108 may thus step through more than four addresses.

These instructions are applied to configuration store 104, causing configuration store 104 to update the values of the four or more addressed bits. The modification addresses are also provided to controller 108, which stores the most significant bits of the address and determines which parts of the configuration store have been modified. Additional changes beyond the four bits that control connectivity may also be made.

After a change to the configuration store is completed (which may include a disconnection, a new connection, a latency change, and a buffer change, for example) controller 108 sends a direct memory access sequence to configuration store 104, which causes configuration store 104 to transmit a partial bitstream to PLD 102, comprising the data to be changed in the PLD to achieve the desired connectivity. Controller 108 a clock signal to PLD 102 to synchronize shifting of the(partial bitstream from configuration store 104 to a shift register within PLD 102 and from there to a column of the PLD.

In one embodiment, the configuration data store 104 and the modification store 106 are implemented in separate integrated circuit devices. For example, the configuration data store 104 is implemented SRAM, and the modification store 106 is implemented in a PROM. In an alternative embodiment, a single integrated circuit can be used to store both the configuration data and the modification data. In yet another embodiment, modification store 106 is stored in several integrated circuit devices, some of which include memory used by a system for purposes not related to controlling configuration of the PLD. The types of connections between the controller and configuration data store and between the controller and modification store depend on the type of devices used for storage and upon the type of PLD being configured. In some embodiments, after a frame of reconfiguration is loaded into the PLD, an additional frame or two of data (a pad frame) must be loaded in order to cause the data to be properly shifted to its destination. And a frame length of no-op data may also be required.

Figure 2:
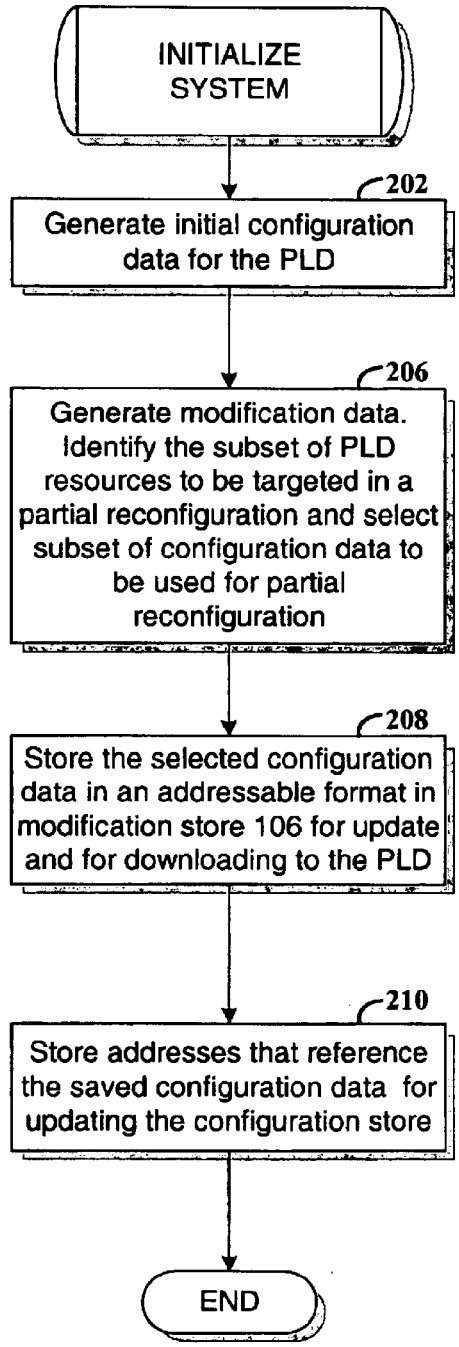
FIG. 2 is a flowchart of an example process for initializing a system in accordance with an example embodiment of the invention.

FIG. 2 is a flowchart of an example process for initializing a system in accordance with an example embodiment of the invention. The initialization process configures the PLD 102, configuration data store 104, and modification store 106 with the data needed for making the PLD operational and for establishing the circuitry that supports partial reconfiguration of the PLD.

The initial configuration data is generated for the PLD (step 202) using tools suitable for implementing the intended design. For example, the design can be implemented using static design tools that process VHDL. Alternatively, the design can be implemented using dynamic design tools such as JBits.

The initialization process identifies the subset of PLD resources that are the target(s) of partial reconfiguration in the system environment (step 206). The subset of resources determines the configuration data that are stored in the configuration data store 104 and the modification data that are stored in modification store 106. It will be appreciated that the design requirements will dictate which PLD resources are in the subset of PLD resources. As indicated previously, a crossbar switch design might have IMUXs in the subset of PLD resources. The particular resources in the subset will be known to the designer, and the designer will use this knowledge to specify the data to be stored in the modification store and how to generate the data to be stored in the configuration store. Having this data pre-calculated and stored in a table such as modification store 106 allows a partial reconfiguration to be accomplished much faster than a process that requires calculating the necessary changes at the time a user specifies a particular change.

In one embodiment, the configuration data in the configuration data store are in an addressable format, and each bit can be separately addressed. Then larger groups of data can be selected for purposes of downloading to the PLD (step 208). For example, the configuration data are stored as configuration blocks that are grouped in a manner that is loadable into the PLD. A block may include one or more addressable frames of data to be loaded into one column of the configuration store in the PLD.

The modification data in modification store 106 includes addresses that reference locations in the configuration data store 104, along with associated data values that update the referenced configuration data. The initialization process stores this modification data in the modification store 106 (step 210).

Figure 3:
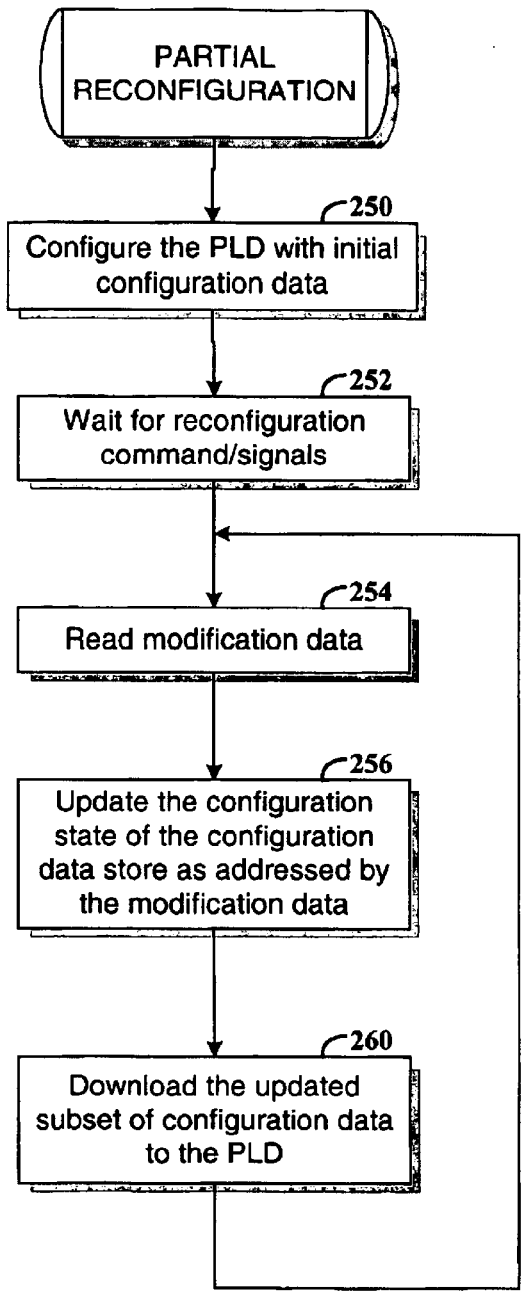
FIG. 3 is a flowchart of an example process for partial reconfiguration of a PLD in accordance with another embodiment of the invention.

FIG. 3 is a flowchart of an example process for partial reconfiguration of a PLD in accordance with another aspect of the invention. The partial reconfiguration, as implemented in the reconfiguration controller, begins by configuring the PLD with initial configuration data (step 250). The reconfiguration process waits for a signal that specifies that the PLD is to be partially reconfigured (step 252).

The process reads the required modification data from modification store 106 (step 254). As explained above, in one embodiment, the required modification data is determined based on an address input to the modification data store 106. In another embodiment, the reconfiguration controller 108 may be left to derive the address in the modification store 106 from the input signal.

Each modification data element provides an address in the configuration store 104 and the new configuration state for the selected resource. In response to the input specification and the address provided by modification store 106, configuration store 104 updates the addressed portion with the data provided by modification store 106 (step 256).

The controller then downloads configuration data from the configuration data store to the PLD (step 260). The configuration data that are downloaded include at least the updated configuration data. The changed configuration data are typically less than a full addressable unit of storage in the configuration data store (e.g., a bit or a few bits versus a frame of data). Thus, in order to update the configuration data in PLD 102, the minimum addressable unit of storage in PLD 102 is loaded from configuration store 104 into PLD 102. It will be appreciated that the amount of configuration data that is downloaded to the PLD depends on the configuration requirements of the PLD and on the application requirements.

Figure 4:
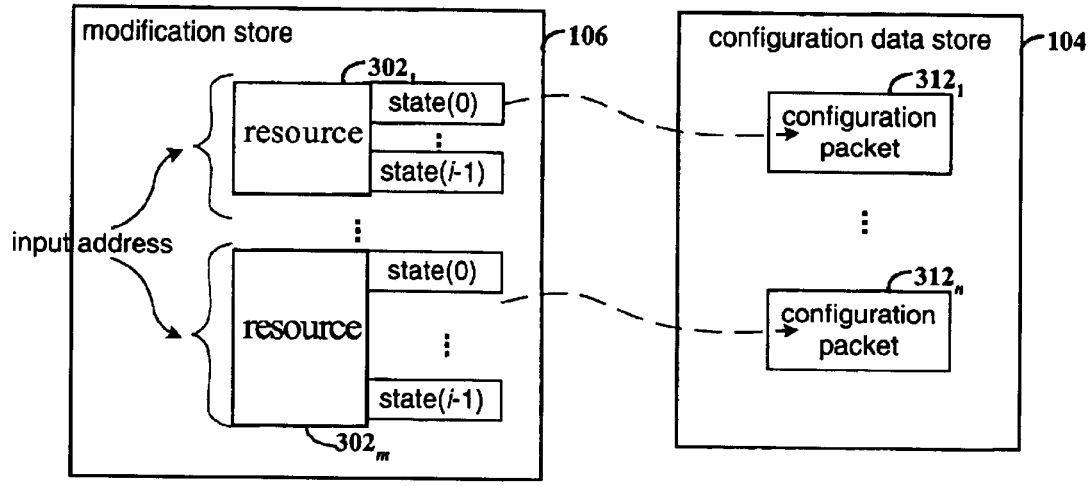
FIG. 4 illustrates the relationship between data items in a modification store and data items in a configuration data store.

FIG. 4 illustrates the relationship between data items in a modification store 106 and data items in a configuration data store 104. There are three levels of information hierarchy in the modification store. First, there is the kind of resource being modified. A multiplexer having 32 possible inputs is one kind of resource. A lookup table with 16 changeable memory cells and four changeable inputs is another kind of resource. Secondly, for each kind of resource, there are data bits that specify the state of that resource. Some resources will be described by many data bits, and others by a few. For example, a 32:1 multiplexer can have 32 different states. A four-input lookup table can have over 65,000 different states, but a control system may be able to select only a few of the possible states, and thus only data values for the selectable states are stored. Thirdly, for each state, all data bits in the PLD that achieve the state are specified by listing addresses and data for these states.

The modification store must provide configuration data bits for each possible state for each of these kinds of resources. Modification store 106 includes resources $302_1$–$302_m$, and state data for each resource. Each resource, each state for that resource, and the associated bits of state data are stored in modification store 106 and include addresses that references configuration data items in the configuration data store 104. Thus, for each input address specified to be changed, there may be several configuration store addresses in the modification store 106 indicating data in PLD 102 for which states must be changed. Thus, in response to one input address, modification store 106 will supply several addresses and for each of the corresponding addresses, modification store 106 will supply the new configuration data.

While data from modification store 106 can be loaded bit by bit into configuration store 104, data in configuration store 104 is formatted into blocks $312_1$–$312_n$ to be loaded into PLD 102. The correspondence between resource addresses and configuration blocks depends on the resources targeted for reconfiguration and the reconfiguration protocol of the PLD targeted for partial reconfiguration. A single configuration block will include configuration data for configuring multiple resources of the PLD.

The multiple resource address entries may reference the same configuration block but at different locations. Or, in response to one input address, modification store 106 may have multiple resource address entries that reference different configuration blocks.

Each resource address has at least one associated state value. For example, resource address $302_1$ has associated state value "state (0)". This same resource address may have a different state value used in response to a different op code. Or the same state value may be used in response to more than one op code. The state values associated with a resource address represent the possible states, which are application dependent, in which the associated resource can be reconfigured. The state value also depends on the type reconfigurable resource, for example, an IMUX versus a lookup table (LUT). It will be appreciated that each state may be comprised of multiple bits. For some PLDs, each bit of a state may correspond to a different address in a configuration block, and each bit would have a different associated resource address.

Figure 5:
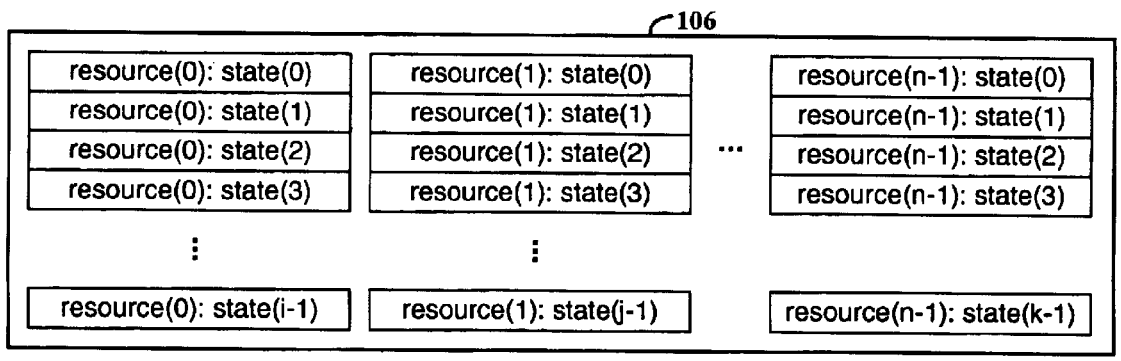
FIG. 5 illustrates an alternative view of the contents of the modification store.

FIG. 5 illustrates an alternative view of the contents of the modification store 106. Each targeted reconfigurable resource of the PLD has an associated set of resource states. For example, resource(0) has possible states of state(0)–state (i–1). Clearly, many formats and arrangements of the modification data are possible.

Figure 6:
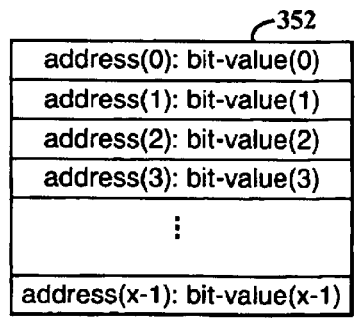
FIG. 6 illustrates the layout of state information associated with a reconfigurable resource of the PLD.

FIG. 6 illustrates a layout of state information associated with a reconfigurable resource of the PLD. Block 352 corresponds to one of the resource(x):state(y) ("state element") pairs illustrated in FIG. 5. Each state element includes one or more addresses and corresponding bit values. This layout addresses the implementation where the configuration bits are in non-contiguous locations in the configuration data store 104.

Repetitive Column Embodiment

Since one column of CLBs is very much like another, it may be preferred to store modification data for one representative column of CLBs and use that data to modify all columns of CLBs in the FPGA.

FIG. 7 illustrates an example format of data 452 stored in the modification store 106 for the embodiment in which the modification store 106 stores information for only one repetitive column. Data 452 includes relative addresses of the configuration bits but doesn't tell which CLB column to place the data into. Ten bits from a source address and the 4 least-significant bits from the destination address, for a total of 14 bits, are used as an address by modification store 106. (The relative word offset is used in combination with the 6 most-significant bits of the destination address to completely address a word in the configuration store 104.

Because 34 configuration bits must be changed each time a request is made to change the source port connected to a destination port, there are 34 "records" for each of the 16 K entries in modification store 106, one record for each configuration bit. Each row in FIG. 7 represents a record.

The relative bit offset field is 5 bits and is used to indicate which bit in the 32-bit word of the SRAM (configuration store 104) is to be modified.

The state field is 1 bit that indicates the state to which the targeted configuration bit is to be set.

FIG. 8 illustrates an example layout of a configuration store 104. The configuration store 104 may be implemented with an SRAM that is addressed in 32-bit words. This configuration store can be used with the reconfigurable crossbar switch implemented on a Virtex-II FPGA from Xilinx, Inc. The SRAM stores reconfiguration blocks, where a reconfiguration block is the data for changing connectivity of one CLB column in the PLD.

The example crossbar switch has 1024 source ports and 1024 destination ports. Thus, 10 bits are required to specify a source, and 10 bits are required to specify a destination for a crossbar switch connection. In the example, there are 16 columns of output lines implemented by each column of CLBs. Thus 1024 output lines require 64 columns of CLBs. In the present crossbar switch, 7 to 9 of these configuration frames are reconfigured to change connectivity of the crossbar switch. Thus the configuration store of FIG. 8 must store data for these 7 to 9 frames.

The 64 reconfiguration blocks of FIG. 8 are addressed by the 6 most significant destination bits of the connectivity change address.

Within the specified reconfiguration block, an additional 12 bits identify which of 4092 32-bit words holds the data to be changed. This is called the relative word offset. Five more bits identify which of the four bytes in the 32-bit word and which bit of the 8-bit byte holds the data to be changed.

Using the 6 most significant bits of the destination address and the relative word offset field from the modification store 106, the SRAM configuration store 104 is addressed as follows:

SRAM_ADDRESS[19:0]=>DST[9:4] & relative-word-offset[11:0] & "XX";

To change the 34 configuration bits needed for a connection or disconnection, the reconfiguration controller uses the 34 associated records from modification store 106 to update the configuration store 104. Because the SRAM is addressable in 32-bit words, not in individual bits, each record is read to a temporary bit-addressable storage location using the above-described addressing scheme, which results in copying a 32-bit word in configuration store 104 to a temporary bit-addressable location, modifying it, and copying it back. The relative bit offset in FIG. 7 provides an index into the 32 bits of data, and the state field indicates the value to which the bit is to be updated. The updated 32 bits of data are then written back to the configuration store 104.

After the configuration data are updated in the referenced reconfiguration block, the controller 108 downloads the configuration data to the PLD 102. In an example embodiment, the SRAM configuration store 104 is addressed by:

SRAM_ADDRESS[19:0]=>DST[9:4] & counter[11:0] & "XX";

where counter[11:0] begins at 0 and is incremented after each read up to the size of the reconfiguration block. For each read, the 32 bits of output data from the configuration store 104 are sequenced into 8-bit bytes for input to the PLD 102.

Algorithmic Embodiment

If the application is very regular, as is the case with the crossbar switch mentioned above, a set of smaller tables plus a more complex controller can replace the large modification table and simple controller discussed above for the first embodiment or the column embodiment discussed above for the second embodiment. An algorithmic approach to partially reconfiguring the FPG greatly reduces the size of the modification store 106. Whereas a flat modification table that stores instructions for changing every connection in the crossbar switch can require as many as 200 megabytes of memory to describe all changes for a 1024×1024 crossbar switch, an algorithmic approach can require only about 20 kilobytes of memory for the same size crossbar switch. Instead of listing changes for every location in the FPGA, the algorithmic method takes advantage of the regularity of the FPGA in terms of both repeating columns of CLBS and repeating CLBs within a column. And instead of providing only a single modification table that lists every change needed for making a change in connectivity, there are several small tables in modification store 106. The controller is more complex because it uses a formula to apply the changes listed in the modification tables to the appropriate portion of the configuration store.

As discussed above, one embodiment modifies 34 bits in the configuration store 104 to change connectivity for one destination. These include bits that change multiplexer connections, bits that change latency, and bits that add a buffer at the corner where the crossbar connection is made if there is no buffer at that corner.

Whereas the single large table simply stores pointers to all bits that need to be modified and provides the data to be entered, the combination of smaller tables and algorithms works as follows.

A CLB tile table indexed by the name of the horizontal input line lists all possible combinations of horizontal-to-vertical connections that can be made within the CLB tile and the configuration store values needed to make the connection. As discussed in the related patent application, there are 32 horizontal input lines and 8 vertical output lines plus an additional vertical input line to be used if no horizontal input line is used. Thus, the CLB tile table has 256+8 entries. The CLB tile table may be formed as two tables, a first table with 256 entries to indicate connections from each of 32 horizontal lines to each of 8 vertical lines and a second table with eight entries, one for each of the 8 vertical lines.

The procedure for modifying a horizontal connection is as follows: a LUT number, which defines which of the 8 vertical lines being accessed, and horizontal line number are used to index the first table. The entry in the first table describes the location of two bits required to break that connection and two bits to make that connection. That entry in the table also gives information on how to connect a constant logic 1 voltage source to the same point the horizontal line was connected to. So if a horizontal line is disconnected, a logic 1 is connected in its place. If a horizontal line is to be connected, the associated logic 1 is first disconnected.

The second CLB tile table has eight entries, one for each lookup table (LUT) in a CLB tile. (In a Virtex-II CLB, there are eight in each CLB). Each entry contains the information to connect a specific vertical output line to the LUT referenced (since there is a one-to-one connection between LUTs and vertical output lines), and also contains the associated logic 1 connection information for that LUT. So when disconnecting a horizontal connection, the next step is to disconnect the logic 1 from the vertical output line, and then connect the vertical output line, which makes whole the vertical cascade chain. When connecting a horizontal connection, the vertical output line must first be disconnected from the appropriate LUT and a logic 1 source attached in it's place. Only then can the horizontal connection table be referenced and the horizontal connection be made.

The output of this CLB tile table references where in the CLB tile the connections are to be made or broken, but does not specify what row or column of CLBs is being changed. Thus the controller implements a formula, reading the original input address that specifies the input line and output line to be connected, determines which CLB is addressed, and applies the instructions from the CLB tile table to the appropriate location in configuration store 104.

There is also a current status table indexed by vertical output line that stores the current horizontal input line being connected to the vertical output line. When a new connection to a vertical output line is specified, this table is used to break the old connection to that output line. This current status table causes the CLB tile table to generate a "break" change of connectivity before the new specification causes the CLB table to generate the new "make" change of connectivity. This table is updated when any new connection is made, in order to keep current the state of the crossbar switch.

An output multiplexer (OMUX) table stores indications of which output signals are currently being buffered as they are output from the CLB tile, and is changed when a pipeline buffer must be added or may be removed in response to a change in connectivity. This table is also used in combination with the controller formula to make changes to appropriate parts of the configuration store.

A latency table stores values needed to achieve the appropriate amount of latency. As discussed in the related patent application Ser. No. 10/164,508, some CLBs at the output ends of the crossbar switch add latency to paths through the crossbar switch that are short and would otherwise have less delay than longer paths through the switch. The result is that all paths have the same latency. In order to achieve the same latency, the controller 108 determines the required latency needed based on the row number and column number of the tile in which the modification is being made. The table lists which routing lines can be used as a source of logic 1 and logic 0 values, based on which output of a LUT within a CLB will provide the output signal to the output line (based on how many shifts of the shift register are needed to achieve the desired latency).

This combination of tables allows the necessary information to be generated quickly and provided as a bitstream from a reconfiguration block to an addressed column in the Virtex-II FPGA. This combination of tables requires only 20 kilobytes of memory. The small size is an advantage. Such a combination of tables is useful for highly repetitive applications, such as the above crossbar switch.

For more general applications, the earlier described larger table provides more flexibility since it can accommodate an irregular configuration arrangement.

The present invention is believed to be applicable to a variety of systems for configuring PLDs and has been found to be particularly applicable and beneficial in partial reconfiguration of FPGAS. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit arrangement for partially reconfiguring a programmable logic device (PLD) having a plurality of reconfigurable resources, comprising:

a configuration store arranged for storage of configuration data for a selected subset of the reconfigurable resources;

a modification store configured with addresses and associated data values, wherein each address references an address in the configuration store, and each associated data value indicates a configuration state for one of the reconfigurable resources of the PLD; and a controller coupled to the configuration and modification stores and to the PLD, the controller arranged to, in response to a reconfiguration signal, read at least one address and at least one associated data value from the modification store, update the configuration store at the at least one address read from the modification store with the at least one associated data value, and download configuration data from the configuration store to the PLD.

2. The circuit arrangement of claim 1, wherein the controller is further arranged to address the modification store with data from the reconfiguration signal.

3. The circuit arrangement of claim 1, wherein the controller is implemented in the PLD.

4. The circuit arrangement of claim 1, wherein the PLD is a first PLD, and the controller is implemented in a second PLD.

5. The circuit arrangement of claim 1, wherein the controller is implemented in an ASIC.

6. The circuit arrangement of claim 3, wherein the PLD is an FPGA.

7. The circuit arrangement of claim 6, wherein the FPGA includes a plurality of lookup tables having respectively associated input multiplexers, and the selected subset of reconfigurable resources of the PLD include a subset of the input multiplexers.

8. The circuit arrangement of claim 1, wherein the configuration store is an SRAM and the modification store is a PROM.

9. A circuit arrangement for partially reconfiguring a programmable logic device (PLD) having a plurality of reconfigurable resources, comprising:

a memory arrangement arranged for storage of configuration data for a selected subset of the reconfigurable resources, and configured with addresses and associated data values, wherein each address references a reconfigurable resource of the PLD, and each associated data value indicates a configuration state for the resource; and a controller coupled to the memory arrangement and to the PLD, the controller arranged to, in response to a reconfiguration signal, read at least one address and at least one associated data value from the memory arrangement, update configuration data at the at least one address with the at least one associated data value, and download configuration data from the memory arrangement to the PLD.

10. The circuit arrangement of claim 9, wherein the controller is further arranged to address the memory arrangement with data from the reconfiguration signal.

11. The circuit arrangement of claim 9, wherein the controller is implemented in the PLD.

12. The circuit arrangement of claim 9, wherein the PLD is a first PLD, and the controller is implemented in a second PLD.

13. The circuit arrangement of claim 9, wherein the PLD is an FPGA.

14. The circuit arrangement of claim 13, wherein the FPGA includes a plurality of lookup tables having respectively associated input multiplexers, and the selected subset of reconfigurable resources of the PLD include a subset of the input multiplexers.

15. A method for controlling partial reconfiguration of a programmable logic device (PLD) having a plurality of reconfigurable resources, comprising:

storing configuration data for a selected subset of the reconfigurable resources;

storing addresses and associated data values, wherein each address references associated configuration data, and each associated data value indicates a configuration state for one of the reconfigurable resources of the PLD;

reading, in response to a reconfiguration signal, at least one stored address and at least one associated data value;

updating the configuration data referenced by the at least one address with the at least one associated data value; and downloading updated configuration data to the PLD.

16. The method of claim 15 wherein the step of reading, in response to a reconfiguration signal, a stored address and associated data value comprises reading in response to a reconfiguration signal a plurality of stored address and associated data values.

17. The method of claim 15, wherein at least one of the data values is comprised of a plurality of portions and each portion has an associated address, the method further comprising reading, for a data value having a plurality of portions, the plurality of data portions and associated addresses, and updating configuration data at the addresses read with the associated portions of the data value.

18. The method of claim 15, further comprising:

storing the configuration data for the selected subset of the reconfigurable resources in an SRAM; and storing the addresses and associated data values, in a PROM.

19. An apparatus for controlling partial reconfiguration of a programmable logic device (PLD) having a plurality of reconfigurable resources, comprising:

means for storing configuration data for a selected subset of the reconfigurable resources;

means for storing addresses and associated data values, wherein each address references associated configuration data, and each associated data value indicates a configuration state for one of the reconfigurable resources of the PLD; and means for reading, in response to a reconfiguration signal, at least one stored address and at least one associated data value, updating the configuration data referenced by the at least one address with the at least one associated data value, and downloading updated configuration data to the PLD.

20. A method of controlling reconfiguration of a PLD comprising:

sending an address of a configuration to be changed;

looking up at least one PLD address and corresponding data for implementing the configuration to be changed;

loading the corresponding data into a configuration store representing the PLD at the at least one PLD address; and loading a block of configuration store data that include the corresponding data into the PLD.

21. A system for controlling a crossbar switch comprising:

a PLD for implementing the crossbar switch;

a modification store responsive to an input op code and configured to provide at least one PLD address and at least one corresponding configuration value to implement the op code;

a configuration data store for storing configuration values for configuring the PLD; and a reconfiguration controller that causes the modification store to provide an address and data to the configuration data store in response to an input address and the input op code.

22. The system of claim 21 wherein the reconfiguration controller also causes data from the configuration data store to be loaded into the PLD.

* * * * *